(12) United States Patent
Walker et al.

(10) Patent No.: US 8,399,939 B2
(45) Date of Patent: Mar. 19, 2013

(54) COLOR SELECTIVE PHOTODETECTOR AND METHODS OF MAKING

(75) Inventors: Brian J. Walker, Somerville, MA (US);
August Dorn, Cambridge, MA (US);
Vladimir Bulovic, Lexington, MA (US);
Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 81 days.

(21) Appl. No.: 12/960,090

(22) Filed: Dec. 3, 2010

(65) Prior Publication Data
US 2012/0138901 A1 Jun. 7, 2012

(51) Int. Cl.
H01L 27/14 (2006.01)
H01L 29/84 (2006.01)
H01L 31/00 (2006.01)
H01L 21/00 (2006.01)

(52) U.S. Cl. .......... 257/414; 257/440; 257/448; 438/48; 977/762; 977/847

(58) Field of Classification Search .................. 257/414, 257/440, 448; 438/48; 977/762, 847
See application file for complete search history.

(56) References Cited

U.S. PATENT DOCUMENTS

| | | | |
|---|---|---|---|
| 6,322,901 B1 | 11/2001 | Bawendi et al. | |
| 6,576,291 B2 | 6/2003 | Bawendi et al. | |
| 7,160,613 B2 | 1/2007 | Bawendi et al. | |
| 7,223,474 B1 * | 5/2007 | Shelnutt et al. | 428/403 |
| 7,390,568 B2 | 6/2008 | Kim et al. | |
| 7,972,694 B2 * | 7/2011 | Sekiguchi et al. | 428/403 |
| 2006/0159901 A1 | 7/2006 | Tischler | |
| 2006/0216610 A1 | 9/2006 | Galvin et al. | |
| 2007/0119496 A1 * | 5/2007 | Baldo et al. | 136/252 |
| 2007/0290195 A1 * | 12/2007 | Forrest | 257/40 |
| 2008/0316480 A1 * | 12/2008 | Zhong et al. | 356/301 |
| 2009/0072751 A1 * | 3/2009 | Tischler et al. | 315/169.3 |
| 2010/0148152 A1 | 6/2010 | Dorn et al. | |

FOREIGN PATENT DOCUMENTS

WO 2007/018570 2/2007
WO WO 2009/083748 7/2009

OTHER PUBLICATIONS

U.S. Appl. No. 60/624,187, filed Nov. 3, 2004, Tischler et al.
U.S. Appl. No. 60/403,367, filed Aug. 15, 2002, Bawendi et al.
Basham, J.I., et al. *ACS Nano* 4,1253-1258 (2010).
Birkan, B.; Gulen, D.; Ozcelik, S. *Journal of Physical Chemistry B* 2006, 110, 10805-10813.
Bradley, M.S. et al., *Advanced Materials* 2005, 17, 1881.
Chang, C.-C., et al. *Nano Lett.* 10, 17041709 (2010).
Dorn, A., Wong, C.R. and Bawendi, M.G. *Adv. Mater.* 21, 3479-3472 (2009).
E.E. Jelley, *Nature* 1936, 138, 1009.
Fukumoto, Y. Yonezawa, *Thin Solid Films* 1998, 329.
G. Decher, J. D. Hong, J. Schmitt, *Thin Solid Films* 1992, 210, 831.
Knoester, J. *Journal of Chemical Physics* 1993, 99, 8466-8479.
Kronik, L. and Koch, N. *MRS Bull.* 35, 422 (2010).

(Continued)

Primary Examiner — Luan C Thai
(74) Attorney, Agent, or Firm — Steptoe & Johnson LLP

(57) ABSTRACT

A photoelectric device, such as a photodetector, can include a semiconductor nanowire electrostatically associated with a J-aggregate. The J-aggregate can facilitate absorption of a desired wavelength of light, and the semiconductor nanowire can facilitate charge transport. The color of light detected by the device can be chosen by selecting a J-aggregate with a corresponding peak absorption wavelength.

23 Claims, 6 Drawing Sheets

OTHER PUBLICATIONS

Lidzey, D., et al. *Science*, 228, 1620-1623 (2000).
Lim, I.-I. S.; et al., *J. Phys. Com. B* 2006, 110, 6673-6682.
M. Era, C. Adachi, T. Tsutsui, S. Saito, *Chem. Phys. Lett.* 1991, 178, 488.
Mattoussi, H.; et al., *J. Am. Chem. Soc.* 2000, 122, 12142-12150.
Mishra, A.; et al., *Chem. Rev.* 2000, 100, 1973-2011.
Rubtsov, I. V.; et al., *J. Phys. Chem. A* 2002, 106, 2795-2802.
S. Bourbon, M. Y. Gao, S. Kirstein, *Synthetic Metals* 1999, 101, 152.
Snaith, H. J., et al. *J. Phys. Chem. C.* 20, 7562-7566 (2008).
Vanburgel, M.; Wiersma, D. A.; Duppen, K. *Journal of Chemical Physics* 1995, 102, 20-33.
Walker, B. J., et al. *J. Am. Chem. Soc.* 131, 9624-9625.
Walker, B.J., Bulović, V., and Bawendi, M.G. *Nano. Lett.*. 10, 3995-3999 (2010).
Yum, et al. *Angew. Chem. Int. Ed.* 48,9277-9280 (2009).
Zhang, Q.; et al., *Nat Nano* 2007, 2, 555-559.
Shirasaki et al., *Microsystems Technology Laboratories Annual Research Report*, PH.11, 2009.
Walker, et al., *J. Phys. Chem. C.*, 2011, 115, 2470-2475.
Qidong Zhao et al. "Photovoltaic properties of a ZnO nanorod array affected by ethanol and liquid-crystalline porphyrin," Nanotechnology, vol. 19, No. 24, Jun. 18, 2008, pp. 245706.
Qiang Zhang et al., "Highly Efficient Resonance Energy Transfer in Ultrathin Organic-Inorganic Semiconductor Hybrid Films," CLEO '07, 2007 Conference on Lasers and Electro-Optics, May 5-11, 2007, Baltimore, MD USA, OSA, Piscataway, NJ, USA, May 6, 2007, pp. 1-2.
A.J. Said et al., " Hybrid Bulk Heterojunction Solar Cells Based on P3HT and Porphyrin-Modified ZnO Nanorods," Journal of Physical Chemistry C, vol. 114, No. 25, Jul. 1, 2010, pp. 11273-11278.
Brian J. Walker et al., "Color-Selective Photocurrent Enhancement in Coupled J-Aggregate/Nanowires Formed in Solution," Nano Letters, vol. 11, No. 7, Jul. 13, 2011, pp. 2655-2659.
International Search Report; PCT/US2011/062431; mailed Sep. 26, 2012.

\* cited by examiner

COLOR SELECTIVE PHOTODETECTOR AND METHODS OF MAKING

FEDERALLY SPONSORED RESEARCH

This invention was made with Government support under Grant No. W911NF-07-D-0004, awarded by the Army Research Office and under Grant No. DE-FG02-07ER46454, awarded by the Department of Energy. The Government has certain rights in this invention.

TECHNICAL FIELD

The present invention relates to a color selective photodetector and methods of making the same.

BACKGROUND

In general terms, a photodetector is a device that generates an electrical current when illuminated. Photodetectors can respond differently depending on the wavelength of the illumination, depending on the materials used to construct the photodetector.

J-aggregates are clusters of coherently-coupled molecular dyes. Their intense absorptions and ultrafast excited state lifetimes make them useful as light sensitizers for film photography, and for such potential applications as color-selective CCD operations and biomimetic color imaging. However, application of J-aggregates in optoelectronic devices has lagged, due to the difficulty of controlling the formation of aggregates and the low charge carrier mobility of many J-aggregates in solid state.

SUMMARY

In one aspect, a device includes a first electrode and a second electrode, a plurality of semiconductor nanowires in electrical communication with the first electrode and the second electrode, and a J-aggregate electrostatically associated with at least a portion of the plurality of semiconductor nanowires.

The plurality of semiconductor nanowires can include a Group II-VI compound, a Group II-V compound, a Group III-VI compound, a Group III-V compound, a Group IV-VI compound, a Group IV compound, a Group II-IV-VI compound, a Group IV compound, a Group V compound, or a mixture thereof. The plurality of semiconductor nanowires includes ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, Si, Ge, or a mixture thereof.

The plurality of semiconductor nanowires can include a ligand bound to a surface of the semiconductor nanowire, where the ligand can include a first moiety having an affinity for a surface of the nanowire, and a second moiety bearing an electrostatic charge. The J-aggregate can bear an electrostatic charge opposite to the electrostatic charge of the second moiety. The ligand can be a polydentate ligand. The ligand can include more than one moiety bearing an electrostatic charge. The ligand can be an oligomer or polymer.

In another aspect, a method of making a device includes forming a plurality of semiconductor nanowires, contacting the plurality of semiconductor nanowires with a ligand, where the ligand includes a first moiety having an affinity for a surface of the nanowire, and a second moiety bearing an electrostatic charge, contacting the plurality of semiconductor nanowires with a J-aggregate, and arranging the plurality of semiconductor nanowires in electrical communication with a first electrode and a second electrode.

Forming the plurality of semiconductor nanowires can include contacting a first electrode and a second electrode with a reactant solution, and applying an electric field across the first electrode and the second electrode, where at least one electrode includes a catalyst. The first electrode and the second electrode can be supported on a substrate. The substrate can include glass, quartz, or silicon.

The first electrode and the second electrode can be facing electrodes separated by a gap. The gap can be between 10 nm and 100 microns in width. In some circumstances, at least one electrode can include platinum and titanium. The catalyst can include a seed particle. The catalyst can include bismuth.

The method can further include heating the reactant solution to a growth temperature between 120° C. and 400° C. The reactant solution can include a metal source and a chalcogenide source. The metal source can include cadmium. The chalcogenide source can include selenium.

Other features, objects, and advantages will be apparent from the description and drawings, and from the claims.

DETAILED DESCRIPTION

Figure 1:
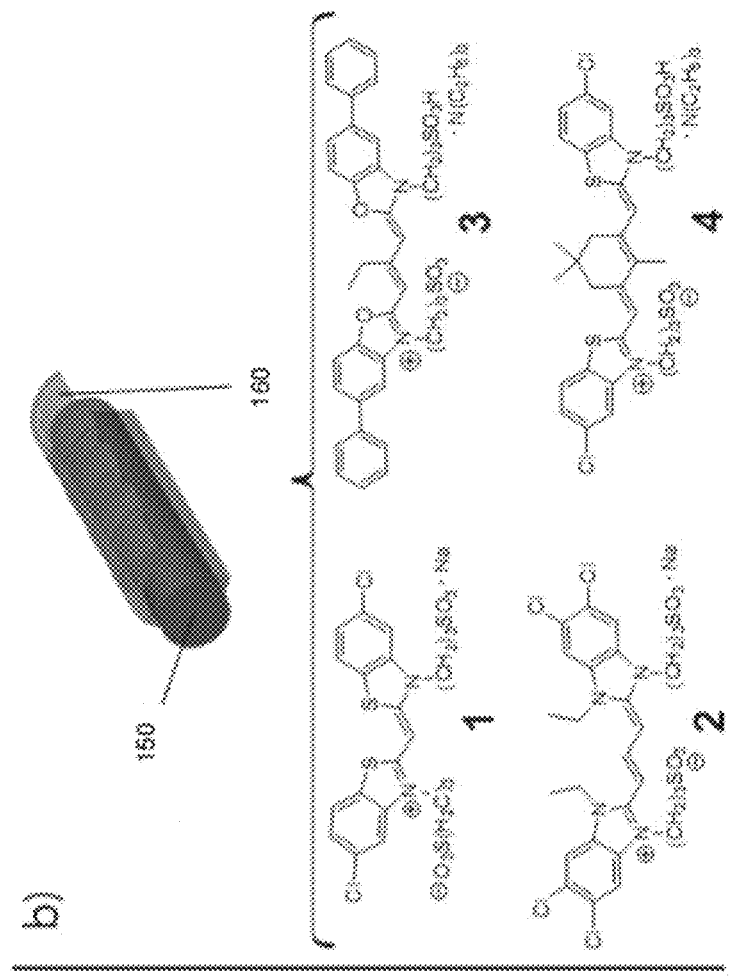
FIG. 1A is a schematic depiction of a photodetector.
FIG. 1B is a schematic depiction of a semiconductor nanowire/J-aggregate composite, and includes structures of certain J-aggregating dyes.
Figure 1:
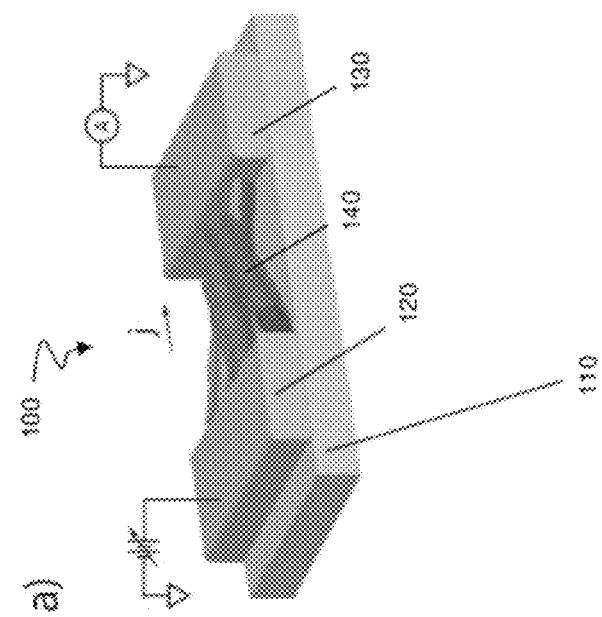

In general, a photodetector performs two functions: absorbing light, thereby generating an excited-state charge pair; and separating the charges of the excited-state charge pair. High performance light harvesting devices typically use crystalline inorganic semiconductors that achieve both functions. Lower cost technologies, however, often entail sacrifices of either light absorption or charge transport.

Absorption-limited performance is characteristic of conventional dye-sensitized solar cells. Sensitizers attenuate ~100 times less light at their absorption maximum than either photosynthetic light harvesting complexes or J-aggregated cyanine dyes (see, e.g., Snaith, H. J., et al. *J. Phys. Chem. C.* 20, 7562-7566 (2008), which is incorporated by reference in its entirety). On the other hand, a light harvesting process without adequate charge carrier extraction leads unproductive relaxation of the excited state. Transport limitations are characteristic of many low-cost semiconductors, including organic and polycrystalline inorganic materials (see, for example, Kronik, L. and Koch, N. *MRS Bull.* 35, 422 (2010), which is incorporated by reference in its entirety). Even when the absorption of solution-processed photodetectors has been enhanced by plasmon coupling, the short exciton diffusion length of the solution-processed semiconductors is ultimately limiting. See Chang, C.-C., et al. *Nano Lett.* 10, 17041709 (2010), which is incorporated by reference in its entirety. Another strategy to enhance light harvesting device performance is to use excitation energy transfer although many such devices still rely on electron transfer, with the associated spatial limitations. See, for example, Yum, et al. *Angew. Chem. Int. Ed.* 48, 9277-9280 (2009), and Basham, J. I., et al. *ACS Nano* 4, 1253-1258 (2010), each of which is incorporated by reference in its entirety.

A photodetector can be based entirely on energy transfer from J-aggregates to a biased crystalline inorganic semiconductor. This design separates the light harvesting and charge transport functions between two materials, each optimized for its role. J-aggregates have large absorption cross sections at their spectral maxima: a J-aggregate film just 13 nm thick can attenuate 40% of incident light. See, e.g., Walker, B. J., Bulovia, V., and Bawendi, M. G. *Nano. Lett.* 10, 3995-3999 (2010), which is incorporated by reference in its entirety. Accordingly, J-aggregates are well suited to a light-absorbing role. However, J-aggregates have low charge carrier mobilities in the solid state, on the order of $10^{-6}$-$10^{-4}$ cm$^2$ V$^{-1}$ s$^-$, and are therefore not well suited to a charge transport role.

Semiconductor nanowires, in contrast, can have high crystallinity and Ohmic contacts, making them ideal for photocurrent transport, even across a 10 μm gap. However, they are not necessarily well suited to color selective light absorption. CdSe nanowires, for example, can have a continuous absorption above the band edge (1.74 eV).

With reference to FIGS. 1A and 1B, a device 100 includes a substrate 110 on which first electrode 120 and second electrode 130 are arranged. Interposed between electrodes 120 and 130 are semiconductor nanowires 140. Nanowires 140 include semiconductor core nanowire 150 and electrostatically associated J-aggregate 160. FIG. 1B illustrates the structures of several suitable J-aggregate dyes labeled 1, 2, 3, and 4.

A J-aggregating material can have individual dipoles that can couple together to produce a coherent quantum mechanical state (a j-band state). These j-band states are known to absorb and emit light with a very narrow full width half max (FWHM) of 15 nm or less, sometimes as small as 5 nm. J-aggregates are generally charged; the charged nature of the J-aggregated can be exploited to form electrostatically associated conjugates with other materials capable of undergoing energy transfer with the J-aggregate. See, for example, WO/2007/018570, which is incorporated by reference in its entirety.

The J-aggregation effect is made possible by the flat, elongated morphology of the cyanine dye, which controls packing, and the presence of a strong dipole formed from a conjugated pi system that forms the backbone of the molecule. The dye 1,1',3,3'-tetraethyl-5,5',6,6'-tetrachlorobenzimidazolo-carbocyanine chloride (TTBC) has been proposed to occur in a "herringbone" or "staircase" type arrangement. See, e.g., Birkan, B.; Gulen, D.; Ozcelik, S. *Journal of Physical Chemistry B* 2006, 110, 10805-10813, which is incorporated by reference in its entirety. When the dye monomers are positioned and aligned such that their optical transition dipoles couple strongly and constructively, the aggregates form the collectively emitting J-band state, whose signature photoluminescence (PL) spectrum is red-shifted and considerably narrower than the PL of the monomer. See, for example, Vanburgel, M.; Wiersma, D. A.; Duppen, K. *Journal of Chemical Physics* 1995, 102, 20-33; and Knoester, J. *Journal of Chemical Physics* 1993, 99, 8466-8479, each of which is incorporated by reference in its entirety.

These cyanine dyes often occur as organic salts (Mishra, A.; et al., *Chem. Rev.* 2000, 100, 1973-2011, which is incorporated by reference in its entirety). Typically, the lumophore component is positively charged due to the partial positive charge on the amine moieties that are coupled to the conjugated pi system that forms the color center of the molecule. The lumophore may instead be negatively charged overall. The resulting J-aggregates are nanoscale charged species generally dispersible in a number of polar solvents, including water and alcohols. Solvent choices can be limited by the conditions required to promote aggregation. These ionic species have been previously shown to adsorb readily onto a charged surface (Fukumoto, Y. Yonezawa, *Thin Solid Films* 1998, 329; and Bradley, M. S. et al., *Advanced Materials* 2005, 17, 1881) to AgBr nanocrystalline grains (Rubtsov, I. V.; et al., *J. Phys. Chem. A* 2002, 106, 2795-2802), and to charged Au nanocrystals in solution (Lim, I.-I. S.; et al., *J. Phys. Chem. B* 2006, 110, 6673-6682) (each of which is incorporated by reference in its entirety). They have also been shown to be efficient FRET acceptors and donors when assembled above a film of layer-by-layer deposited polyelectrolyte-CdSe/ZnS nanocrystal monolayers (Zhang, Q.; et al., *Nat Nano* 2007, 2, 555-559, which is incorporated by reference in its entirety). Electrostatic synthesis of complex compounds involving nanocrystals has also been demonstrated using dihydrolipoic acid (DHLA) coated, negatively charged nanocrystals and positively charged polypeptides such as a leucine zipper (see, for example, Mattoussi, H.; et al., *J. Am. Chem. Soc.* 2000, 122, 12142-12150, which is incorporated by reference in its entirety).

J-aggregates of cyanine dyes have long been known for their strong fluorescence. This strong fluorescence makes J-aggregates a desirable candidate for use in organic light-emitting devices (OLEDs), and these devices have been demonstrated. The layer-by-layer (LBL) technique for film growth, first developed by Decher et al., was extended to create thin films of J-aggregates, which have been to create an OLED with J-aggregates as emitters. See, for example, E. E. Jelley, *Nature* 1936, 138, 1009; M. Era, C. Adachi, T. Tsutsui, S. Saito, *Chem. Phys. Lett.* 1991, 178, 488; G. Decher, J. D. Hong, J. Schmitt, *Thin Solid Films* 1992, 210, 831; H. Fukumoto, Y. Yonezawa, Thin Solid Films 1998, 329, 748; S. Bourbon, M. Y. Gao, S. Kirstein, *Synthetic Metals* 1999, 101, 152; Bradley, M. S. et al., *Advanced Materials* 2005, 17, 1881; and provisional U.S. Patent Application No. 60/624, 187, filed Nov. 3, 2004, each of which is incorporated by reference in its entirety.

Core nanowires 150 can be formed by the elecrocatalytic controlled solution-liquid-solid method (EC-SLS). See, for example, Dorn, A., Wong, C. R. and Bawendi, M. G. *Adv. Mater.* 21, 3479-3472 (2009), and U.S. Patent Application Publication 2010/0148152, each of which is incorporated by reference in its entirety. A method of producing nanowires can include applying an electric field proximate to a catalyst in contact with a reactant solution. The electric field can be created by a voltage drop applied over two or more electrodes. The voltage drop can be less than 20V, less than 18V, less than 15V, less than 10V, less than 9V, less than 6V, greater than 0V, greater than 100 mV, greater than 250 mV, greater than 500 mV, greater than 1V, greater than 1.5V, greater than 2V or greater than 3V.

The electrodes can be self supporting or can be supported on a substrate. For example, the electrodes can be metal layers deposited on the substrate, which can be glass, quartz or silicon, plastic or other inert, non-conductive solid. The electrodes are arranged on a surface of the substrate to create an electric field to drive growth of a nanowire. For example, the electrodes can be paired on a surface in a facing relationship. One electrode can have a growth region, which can form a gap with a second electrode. The gap can be configured to alter the surface charge density of at least one electrode, which can include increasing the negative surface charge density on the electrode having lower potential. The configuration can be arranged and modeled, for example, by finite element analysis, to create a surface charge density that controls and directs the growth of the nanowire. The gap can be less than 1 mm, less than 500 microns, less than 250 microns, less than 200 microns, less than 150 microns, less than 100 microns, greater than 1 nm, greater than 5 nm, greater than 10 nm, greater than 100 nm, greater than 200 nm, greater than 1 micron, greater than 50 microns, greater 250 microns, or greater than 500 microns, for example, between 10 nm and 50 microns.

The nanowire can be a semiconductor, for example, a metal chalcogenide or metal pnitcide. The nanowire can include Group II-VI compounds, Group II-V compounds, Group III-VI compounds, Group III-V compounds, Group IV-VI compounds, Group compounds, Group II-IV-VI compounds, Group IV compounds or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, Si, Ge, or mixtures thereof.

Each electrode can be a conductive material. The conductive material can include platinum, palladium, silver, gold, titanium, molybdenum, tungsten, zirconium, doped silicon, or combinations, alloys or layers thereof.

The catalyst can be a material configured to seed growth of a nanowire, for example, a seed particle or bead. The catalyst, seed particle or bead can include a metal or semiconductor, for example, bismuth or antimony. In certain circumstances, the catalyst can include bismuth and the semiconductor nanowire can include a metal chalcogenide, such as a II-VI semiconductor, for example, cadmium sulfide, cadmium selenide or cadmium telluride, or alloys thereof.

In general, the method of manufacturing the nanowire is a voltage-assisted modification of a colloidal growth process. See, for example, U.S. Pat. Nos. 6,322,901 and 6,576,291, each of which is incorporated by reference in its entirety. The voltage-assisted modification has the unexpected advantages of growing nanowires in a controlled and directional manner. Growth occurs by rapidly injecting a metal source, for example, an M-containing compound, and an X donor, or chalcogenide source into a solvent, which can be a hot coordinating solvent. Alternatively, it is possible to heat the reaction vessel already containing both the M-containing compound and X donor, making the injection step unnecessary. This can be particularly effective if the reaction conditions and reactants are chosen such that the reaction does not take place at the catalyst surface until a voltage is applied.

The coordinating solvent can include an amine. The M-containing compound can be a metal, an M-containing salt, or an M-containing organometallic compound. The nanowire grows at the surface of the catalyst, which can be grown in a controlled manner.

The reaction mixture can be gently heated, e.g., to a temperature in the range of 120° C. to 400° C., to grow and anneal the nanowire. Both the average size and the size distribution of the nanowires in a sample can be dependent on the growth temperature. The growth temperature necessary to maintain steady growth increases with increasing average nanowire size. The nanowire can be a member of a population of nanowires. As a result of the discrete nucleation and controlled growth, the population of nanowires obtained has a narrow, monodisperse distribution of diameters.

While temperature and other reaction conditions can play an important role in the growth of the nanowire, one of the most important parameters controlling the nanowire diameter is the size and size distribution of the catalyst, in particular, catalyst seed particles. As described herein, for example, the nominal thickness of the bismuth layer (which breaks up into droplets) impacts the diameter of the nanowire. The length of the nanowire can be adjusted or controlled, for example, by precursor concentration, growth time, voltage/electric field/surface charge density, and temperature.

The monodisperse distribution of diameters can also be referred to as a size. The process of controlled growth and annealing of the nanowires in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

The M-containing salt can be a non-organometallic compound, e.g., a compound free of metal-carbon bonds. M is cadmium, zinc, magnesium, mercury, aluminum, gallium, indium, thallium, or lead. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, oxide, or carbonate salts are stable in air and allow nanowires to be manufactured under less rigorous conditions than corresponding metal alkyls.

Suitable M-containing salts can include cadmium acetylacetonate, cadmium iodide, cadmium bromide, cadmium chloride, cadmium hydroxide, cadmium carbonate, cadmium acetate, cadmium oxide, zinc acetylacetonate, zinc iodide, zinc bromide, zinc chloride, zinc hydroxide, zinc carbonate, zinc acetate, zinc oxide, magnesium acetylacetonate, magnesium iodide, magnesium bromide, magnesium chloride, magnesium hydroxide, magnesium carbonate, magnesium acetate, magnesium oxide, mercury acetylacetonate, mercury iodide, mercury bromide, mercury chloride, mercury hydroxide, mercury carbonate, mercury acetate, aluminum acetylacetonate, aluminum iodide, aluminum bromide, aluminum chloride, aluminum hydroxide, aluminum carbonate, aluminum acetate, gallium acetylacetonate, gallium iodide, gallium bromide, gallium chloride, gallium hydroxide, gallium carbonate, gallium acetate, indium acetylacetonate, indium iodide, indium bromide, indium chloride, indium hydroxide, indium carbonate, indium acetate, thallium acetylacetonate, thallium iodide, thallium bromide, thallium chloride, thallium hydroxide, thallium carbonate, or thallium acetate.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids; however, other coordinating solvents, such as pyridines, furans, and amines may also be suitable for the nanowire production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanowire obtained in the process. The 1,2-diol or aldehyde can be a $C_6$-$C_{20}$ 1,2-diol or a $C_6$-$C_{20}$ aldehyde. A suitable 1,2-diol is 1,2-hexadecanediol and a suitable aldehyde is dodecanal.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), sulfur, bis(trimethylsilyl)sulfide (($TMS)_2S$), a trialkyl phosphine sulfide such as (tri-n-octylphosphine) sulfide (TOPS), tris(dimethylamino) arsine, an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

The nanowire manufactured from an M-containing salt grows in a controlled manner when the coordinating solvent includes an amine. The amine in the coordinating solvent can contribute to the quality of the nanowire obtained from the M-containing salt and X donor. Preferably, the coordinating solvent is a mixture of the amine and an alkyl phosphine oxide in a mole ratio of 10:90, more preferably 30:70 and most preferably 50:50. The combined solvent can decrease size dispersion and can improve photoluminescence quantum yield of the nanowire. The preferred amine is a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a nanowire, the photoluminescence quantum efficiency and the distribution of nanowire sizes can be improved in comparison to nanowire manufactured without the 1,2-diol or aldehyde or the amine.

The nanowire can include a core of a semiconductor material. The nanowire can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The outer surface of the nanowire can include a layer of compounds derived from the coordinating agent used during the growth process. The surface can be modified by repeated exposure to an excess of a competing coordinating group to form an overlayer. For example, a dispersion of the capped nanowire can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanowire, including, for example, phosphines, thiols, amines and phosphates. The nanowire can be exposed to short chain polymers which exhibit an affinity for the surface and which terminate in a moiety having an affinity for a suspension or dispersion medium. Such affinity improves the stability of the suspension and discourages flocculation of the nanowire.

Monodentate alkyl phosphines (and phosphine oxides; the term phosphine below will refer to both) can passivate nanowires efficiently. When nanowires with conventional monodentate ligands are diluted or embedded in a non-passivating environment (i.e., one where no excess ligands are present), they tend to lose their high luminescence. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanowire surface. In other words, they are stronger ligands, as is expected from the chelate effect of their polydentate characteristics.

Oligomeric phosphines have more than one binding site to the nanowire surface, which ensures their high affinity to the nanowire surface. See, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, tris(hydroxypropyl)phosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

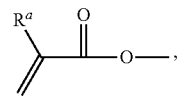

R' has the formula

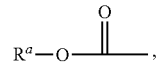

or R' is hydrogen, wherein $R^a$ is hydrogen or $C_1$-$C_4$ alkyl.

A nanowire ligand can include a first moiety with an affinity for a surface of the nanowire and a second moiety bearing an electrostatic charge. The moiety having an affinity for a surface of the nanowire can include, for example, a phosphine, a phosphine oxide, a thiol, an amine, or a phosphate. The moiety bearing an electrostatic charge can include a positive charge (as in the case of, e.g., a quaternary amine) or a negative charge (as in the case of, e.g., a carboxylic acid or a sulfonic acid). The ligand can be a polydentate ligand, i.e., it can have more than one moiety having an affinity for a surface of the nanowire. A polydentate ligand can have a higher affinity for the nanowire than a monodentate ligand. The ligand can have more than one moiety bearing an electrostatic charge. The ligand can be monomeric, oligomeric, or polymeric. A polymeric ligand can be a homopolymer, copolymer, block copolymer, or have another polymeric structure. A nanowire can have more than one different ligand. For example, a nanowire can have a first ligand which bears an electrostatic charge and a second ligand which lacks an electrostatic charge. Control over the electrostatic properties of the nanowire is provided by choosing a ligand or group of ligands for the nanowire. For example, the sign of electrostatic charge of a nanowire may be controlled by selecting a ligand having a moiety bearing an electrostatic charge of the desired sign. If the nanowire is to be used in an electrostatic with another material (e.g., a J-aggregate), the sign of the charge on the ligand can be chosen so as to be of opposite sign of the charge on the other material.

An overcoating process is described, for example, in U.S. Pat. No. 6,322,901, incorporated herein by reference in its entirety. By adjusting the temperature of the reaction mixture during overcoating and monitoring the absorption spectrum of the core, overcoated materials having high emission quantum efficiencies and narrow size distributions can be obtained. Alternatively, an overcoating can be formed by exposing a core nanowire having a first composition and first average diameter to a population of nanowires having a second composition and a second average diameter smaller than the first average diameter.

Size distribution during the growth stage of the reaction can be estimated by monitoring the absorption line widths of the wire. Modification of the reaction temperature in response to changes in the absorption spectrum of the particles allows the maintenance of a narrow wire size distribution during growth. Reactants can be added to the nucleation solution during wire growth to grow longer wires. By stopping growth at a particular nanowire average diameter, a population having an average nanowire diameter of less than 150 Å can be obtained. More generally, the fluorescence wavelength is determined by the wire diameter, which can primarily depend on the diameter of the catalyst seed particles.

A population of nanowires can have an average diameter of up to 1000 Å or higher. The emission spectra of the nanowires can be tuned continuously over the wavelength range of 300 nm to 5 microns, or for example, when CdSe or CdTe is the core material, from 400 nm to 800 nm. IR-emitting semiconductor nanowires can be prepared according to methods described in, for example, U.S. patent application Ser. No. 10/638,546, which is incorporated by reference in its entirety.

Another point of interest is the growth of nanowire heterostructures as described by Ouyang et al., e.g. CdSe wire, which changes its composition to CdS as the precursor in solution is changed. By using the methods described herein, the composition of the nanowire can be altered as it grows by altering the voltage driving the growth and the composition of the reactant solution.

The particle size distribution can be further refined by size selective precipitation with a poor solvent for the nanowires, such as methanol/butanol as described in U.S. Pat. No. 6,322,901, incorporated herein by reference in its entirety. For example, nanowires can be dispersed in a solution of 10% butanol in hexane. Methanol can be added dropwise to this stirring solution until opalescence persists. Separation of supernatant and flocculate by centrifugation produces a precipitate enriched with the largest crystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanowire population can have no more than a 15% rms deviation from mean diameter, preferably 10% rms deviation or less, and more preferably 5% rms deviation or less.

Transmission electron microscopy (TEM) can provide information about the size, shape, and distribution of the nanowire population. Powder X-ray diffraction (XRD) patterns can provide the most complete information regarding the type and quality of the crystal structure of the nanowires. High resolution TEM can enable one to see the crystal structure of individual nanowires at the nanoscale. In addition the crystal structure of single wires can be obtained by performing electron diffraction on sub micron areas. The elemental composition can be determined using STEM.

Estimates of size are also possible since particle diameter is inversely related, via the X-ray coherence length, to the peak width. For example, the diameter of the nanowire can be measured directly by transmission electron microscopy or estimated from X-ray diffraction data using, for example, the Scherrer equation. It also can be estimated from the UV/Vis absorption spectrum, if calibrated by a direct measurement of diameter, such as XRD or TEM.

The temperature can be greater than 150° C. or greater than 200° C. The temperature can be less than 400° C. or less than 350° C. The time can be less than 30 minutes, less than 20 minute, less than 15 minutes, less than 10 minutes, or less than 5 minutes.

An apparatus for producing nanowire can include a reaction vessel, two electrodes positioned within the vessel, a catalyst on at least one electrode, and a voltage control device connected to the electrodes. A reactant solution delivery port is configured to introduce a reactant solution into the vessel. The vessel is inert to the reactant mixture and can provide a temperature control of the solution, for example, via a heater configured to control the temperature of the reactant solution. The reactant solution delivery port can allow the reactant solution to be introduced into the vessel in a controlled environment (e.g., atmosphere, temperature, delivery rate, etc.). The electrodes are oriented to contact the reactant solution under controlled condition s(e.g., temperature, duration, etc.).

The nanowires produced by applying an electric field across the two electrodes in contact with a reactant solution can have advantageous properties or can be easily manufactured into devices, for example, by incorporating the nanowire in the device.

EXAMPLES

CdSe nanowires were grown by the elecrocatalytic controlled solution-liquid-solid method (EC-SLS), from bismuth-coated platinum electrodes. See, e.g., Walker, B. J., et al. *J. Am. Chem. Soc.* 131, 9624-9625, which is incorporated by reference in its entirety. After growth, the CdSe surface was treated with 2-mercaptoethyl-(N,N,N-trimethylammonium) chloride (mta), thus imparting the nanowire surface with positively charged quaternary amine groups. This was followed by deposition of J-aggregated dyes (compounds 1, 2, 3, and 4, FIG. 1B) via spin casting. These J-aggregates were all selected due to their strongly negative electrostatic charge, and the similarity among their chemical functional groups suggested the possibility of a modular deposition process.

Figure 2:
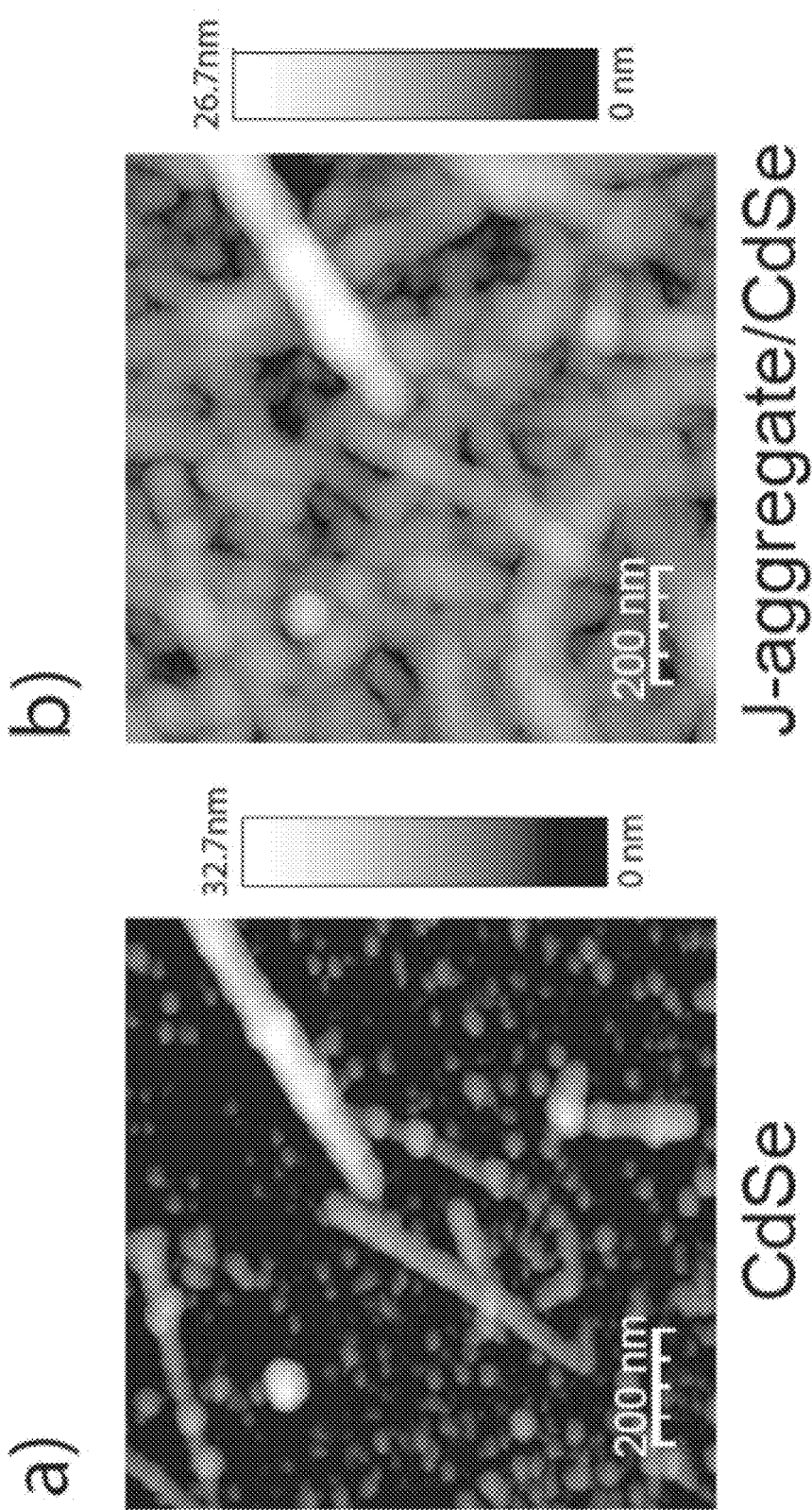
FIGS. 2A and 2B are atomic force micrographs of semiconductor nanowires in a photodetector.

Atomic force micrographs of the device area are shown in FIGS. 2A-2B. Micrographs of a smaller device area taken before (FIG. 2A) and after deposition of J-aggregates (FIG. 2B) showed an increase in the nanowire diameter from ~30 to 60 nm, indicating a radial coating of ~15 nm. Many sulfonated J-aggregates are known to form linear or sheet-like extended structures, so it is plausible that J-aggregates 1, 2, 3, and 4 wrapped efficiently around a charged nanowire surface.

Figure 3:
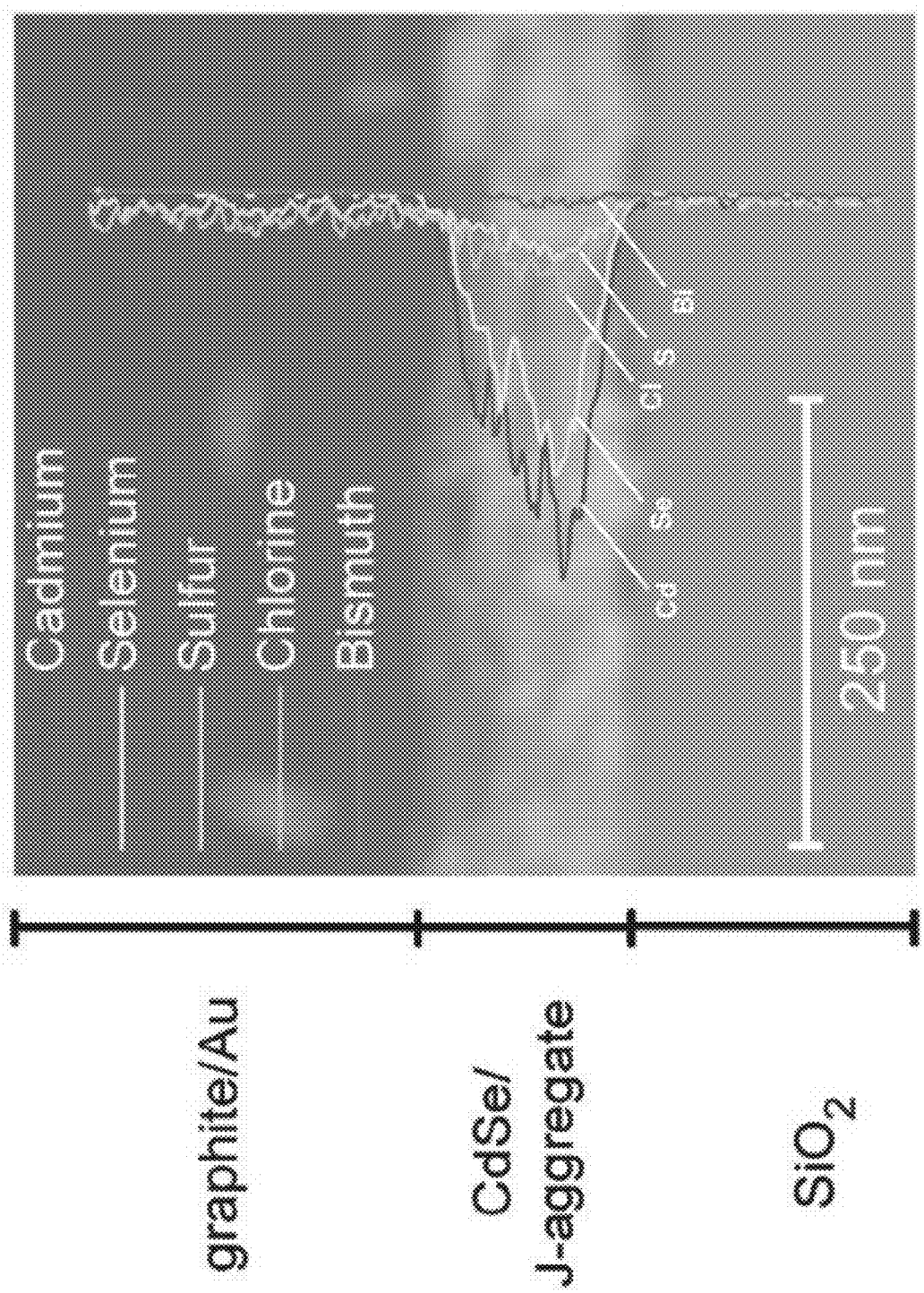
FIG. 3 is a transmission electron micrograph of a J-aggregate-coated nanowire in cross section. Energy dispersive X-ray data is overlaid on the micrograph.

A transmission electron micrograph of a J-aggregate-coated nanowire in cross section is shown in FIG. 3. Elemental line scans were conducted via energy dispersive X-ray analysis and indicate the presence of Cd, Se, S, and Cl. Because the only sources of S and Cl were the organic compounds noted above, this composition analysis was consistent with selective templating on the nanowire surface.

Figure 4:
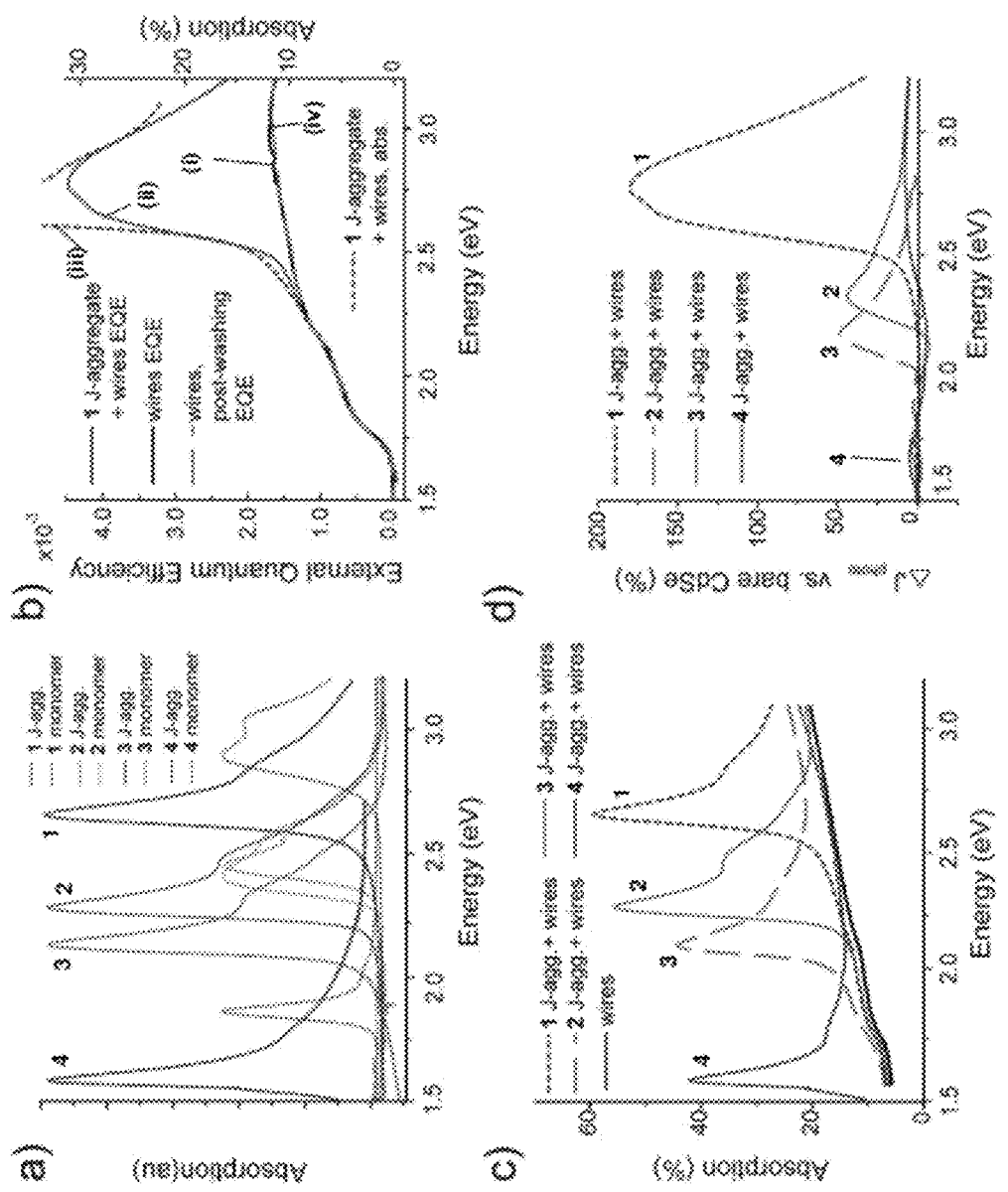
FIGS. 4A-4D are graphs depicting optical and electrical properties of photodetectors.

J-aggregation was evident via optical absorption spectroscopy, as the maximum absorption features of J-aggregates 1-4 were narrow (~50 meV full width at half maximum) and red-shifted (~200 meV) relative to corresponding monomer spectra in dilute methanol solutions (FIG. 4A). J-aggregate absorption features of 1-4 have the same width and position when deposited onto the CdSe devices, indicating that the formation of J-aggregates is unperturbed by the CdSe surface (FIG. 4C).

Figure 6:
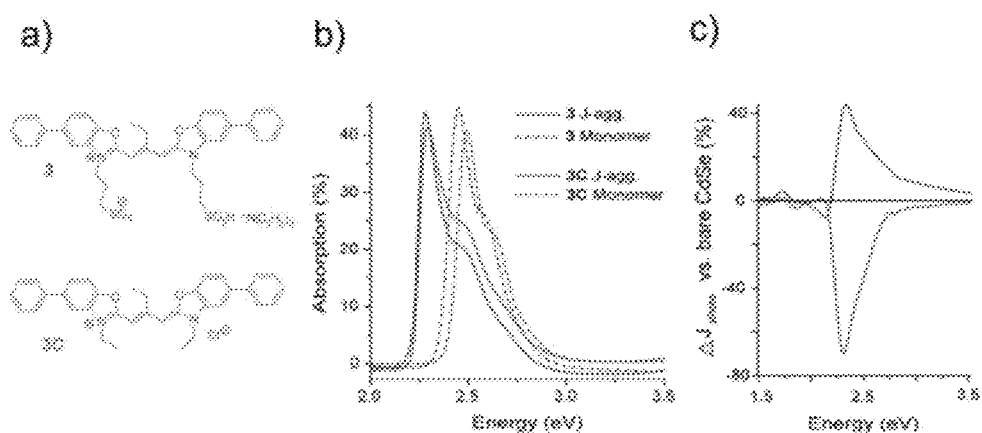
FIG. 6A shows the structures of two J-aggregating dyes.
FIG. 6B is a graph showing optical properties of the dyes under different conditions.
FIG. 6C is a graph illustrating optical and electrical properties of photodetectors.

FIG. 6 shows that electrostatic self assembly is important to device operation. FIG. 6A illustrates the structures of compounds 3 and 3c. The actual chromophores of the monomers are identical, but differ in electrostatic charge. 3 bears a negatively charged sulfonic acid moieties, whereas 3c includes a positively charged quaternary nitrogen. FIG. 6B presents absorption spectra of 3 and 3c, as both J-aggregate films and as monomers in dilute methanol solutions. Both compounds have similar absorption properties in both physical phases, indicating that they have similar energies for their monomer absorptions and the strength of their J coupling. FIG. 6C shows the relative change in the photocurrent density due to J-aggregates 3 and 3c, for J-aggregate/nanowire photodetectors. The negatively-charged 3 enhanced photocurrent by 44%, and the positively-charged 3c attenuated photocurrent by 75% at 535 nm. The contrast between the two J-aggregate behaviors shows the importance of electrostatic assembly for photocurrent enhancement in these photodetectors.

The sensitivity enhancement in J-aggregate/nanowire photodetectors was determined via photoaction spectroscopy. Photocurrent was recorded as a function of excitation wavelength. A representative photoaction spectrum is shown for a device templated with J-aggregate 1 in FIG. 4B. Prior to the deposition of J-aggregates the device had the photoaction spectrum labeled (i). Photocurrent onset occurred at ~1.74 eV, the same as bulk CdSe. After deposition of J-aggregate 1, the photoaction spectrum (ii) retained nanowire features and showed a distinct peak that correlated with the J-aggregate absorption (iii). The photocurrent curve did not reach the top of the absorption curve, indicating that some light absorbed by the J-aggregate did not lead to a photocurrent enhancement. The overall enhancement of the photocurrent was 175% above bare CdSe nanowires at maximum absorption, corresponding to an enhancement factor of 2.8-fold. No photocurrent was observed for J-aggregates deposited in the absence of CdSe wires, indicating that the energy absorbed by the J-aggregates only enhanced the photocurrent via energy transfer to CdSe.

The J-aggregate deposition process was reversible. Washing the devices with TFE removed the J-aggregate, and the original CdSe photoaction spectrum was recovered (FIG. 4B, curve labeled (iv)). To demonstrate the modularity and reversibility of the sensitization method, the four different J-aggregating dyes 1, 2, 3 and 4 were each deposited onto the same device, the photocurrent measured, and the dye removed. The photocurrent enhancement for these dyes is shown in FIG. 4D. Devices made with J-aggregates 1, 2, and 3 all demonstrated enhancement, demonstrating red, green, and blue light sensitization that can be color-switched using exclusively solution processing. The differences in enhancement between the dyes may result from differences in exciton diffusion, J coupling, or solid state morphology that warrant further investigation.

The lack of significant photocurrent enhancement from J-aggregate 4 was expected for an energy transfer mechanism for photocurrent enhancement. Because the maximum of the J-aggregate absorption (1.2 eV) of 4 occurs at lower energy than the band gap of the bulk CdSe nanowires (1.74 eV), there was negligible energy transfer from J-aggregates to CdSe nanowires. As noted, devices with J-aggregates of 1-3 all demonstrate photocurrent enhancement. The enhancement was not due to electron transfer processes, as the J-aggregate layer thickness (>10 nm) and low carrier mobilities in the solid state were incompatible with electron transfer. Furthermore, the system has no external redox process to sustain the observed device operation. Thus, excitation energy transfer was the most plausible explanation for photocurrent enhancement of the nanowires by J-aggregates 1-3.

Figure 7:
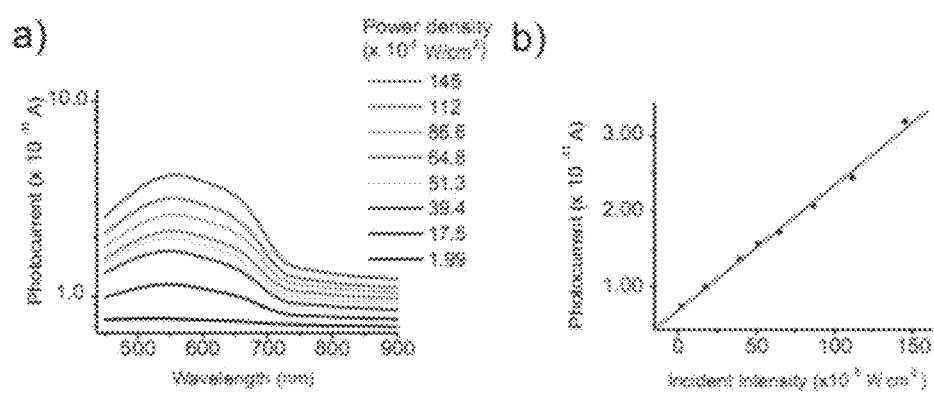
FIG. 7A-7B are graphs showing optical and electrical properties of photodetectors.

FIG. 7 shows that the devices operated with a linear power dependence. FIG. 7A is a plot of photoaction spectra at various light intensities. The similarity in the spectra on the semilog plot demonstrated that the photocurrent enhancement by the J-aggregate was qualitatively similar across many excitation intensities. Photocurrent at the excitation maximum (λ=535 nm) of the J-aggregate 3/nanowire device is shown in FIG. 7B. The photocurrent increased linearly with increasing intensity of the incident light.

Figure 5:
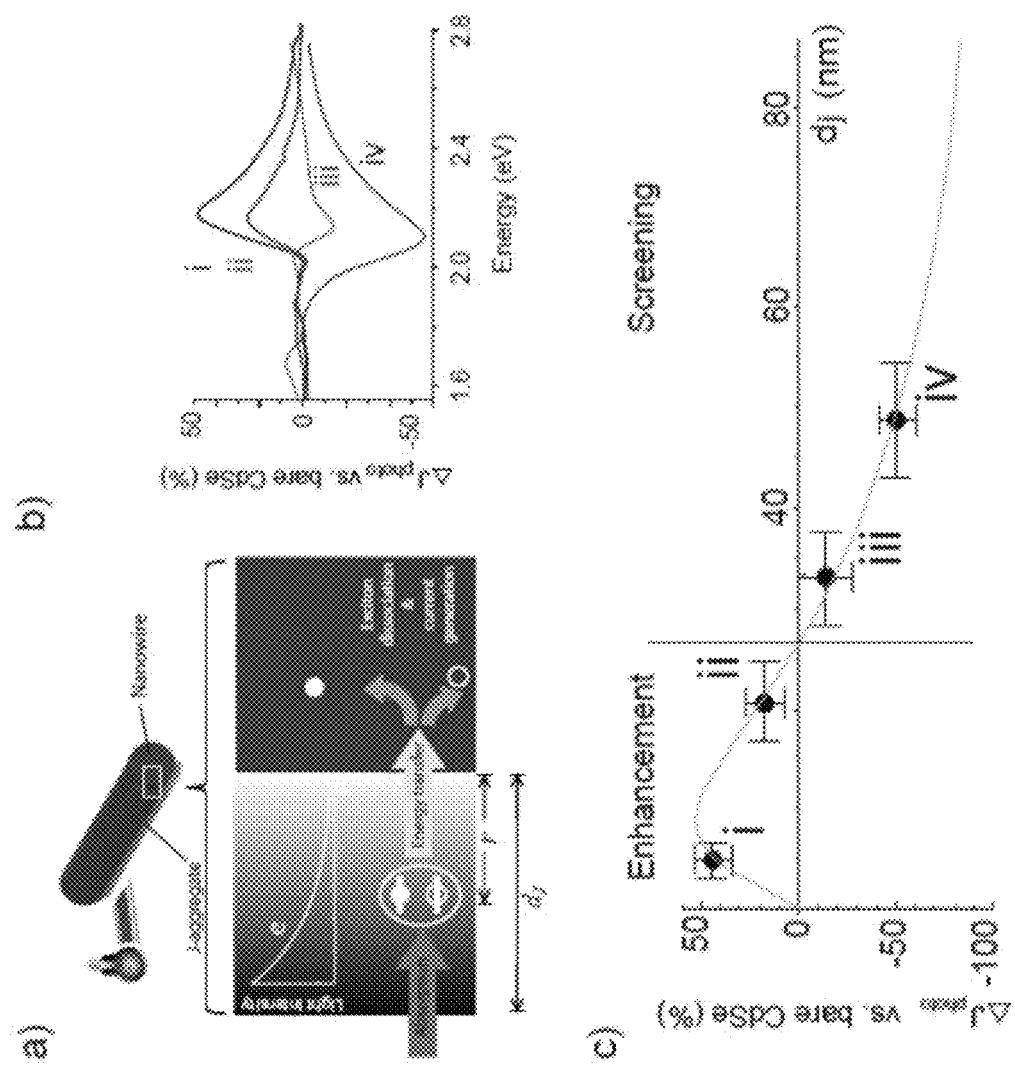
FIG. 5A is a schematic depiction of exciton behavior in a semiconductor nanowire/J-aggregate composite.
FIGS. 5B-5C are graphs showing optical and electrical properties of photodetectors.

Photocurrent enhancement from J-aggregates was highly sensitive to device geometry (FIG. 5A). After absorption, the excitation energy in the J-aggregate must be transferred efficiently to CdSe. Light absorption by the J-aggregates necessarily decreases the amount of light available for absorption directly by the nanowires. For photocurrent enhancement to occur, the effect of J-aggregate energy transfer to the nanowire must outweigh the decrease in direct nanowire light absorption.

To understand the physical constraints on energy transfer, the photocurrent enhancement in J-aggregate/nanowire photodetectors was modeled using the thin film approximation, in which energy transfer from J-aggregates to nanowires was modeled as the point-to-plane interaction of two transition dipoles in the near field. We use a simplified dipole-dipole model:

$$k_{ET} = k_D \left(\frac{r}{R_0}\right)^3$$

where $k_{ET}$ was the energy transfer rate from the J-aggregate to the CdSe nanowire, $k_D$ was the radiative rate of an exciton in the J-aggregate layer, $R_0$ was the characteristic radius for energy transfer (Förster radius), and r was the distance from exciton in the J-aggregate to the CdSe surface. The decrease in light intensity due to absorption was assumed to follow the standard Lambert-Beer law:

$$I = I_0 e^{-\alpha d_J}$$

where $I_0$ was the intensity of incident light, α was the absorption coefficient of the J-aggregate layer, and $d_J$ was the J-aggregate layer thickness (FIG. 5A). In addition, we assumed that energy transfer occurred from the site of absorption in the J-aggregate layer directly to CdSe nanowires.

To determine the change in photocurrent in the CdSe nanowires, it was also necessary to take into account the reduction in direct light absorption by the CdSe resulting from the light absorption by J-aggregates. The net effect of the J-aggregate light absorption was $I_{net}$, and was the difference between the excitation enhancement and reduction due to the presence of J-aggregates:

$$I_{net} = A_W(I_{enhanced} - I_0 e^{-\alpha d_J})$$

where $A_w$ was the absorption efficiency of the plain nanowire photodetector. In the limit of low excitation the exciton creation rate in the nanowires was proportional to the photocurrent. The change in photocurrent as a function of J-aggregate layer thickness $\Delta I_{rel}$ relative to bare CdSe nanowires is:

$$\Delta I_{rel}(d_J) = \frac{1}{A_W} \int \alpha e^{-\alpha x} \frac{1}{1+\left(\frac{d_J-x}{R_0}\right)^3} dx - (1-e^{-\alpha d_J})$$

We compared this model against four J-aggregate/nanowire devices with varying thickness of J-aggregate 2 (FIG. 5B). The parameters for plots were determined from absorption spectra and atomic force microscopy ($\alpha$, $d_J$) from the spectral overlap between donor and acceptor ($R_0$) or determined from literature and the measured topology in the single wire limit ($A_w$). The J-aggregate/nanowire device performance spans the enhancement and screening regimes, solely by depositing thinner or thicker coatings of J-aggregate. Thus, solution phase assembly yielded tunable control over the electrical interactions between J-aggregates and nanowires.

Although excitation energy can migrate long distances between J-aggregate domains, these effects were outside the scope of this simple parameterization. Qualitatively, it is noted that rapid exciton diffusion (i.e., faster than the energy transfer to CdSe) would result in an increase in the optimal layer thickness and in the maximum possible enhancement in photo current will increase.

The photocurrent enhancement described here suggests potential applications in optical multiplexing and communication, as a tandem array of J-aggregates tuned to different wavelengths can resolve the spectrum of an arbitrary light source with high resolution. This J-aggregate nanowire device is also a model system for studying the coupling between Frankel excitons and Wannier Mott excitons (see, e.g., Lidzey, D., et al. *Science,* 228, 1620-1623 (2000), which is incorporated by reference in its entirety).

Other embodiments are within the scope of the following claims.

What is claimed is:

1. A device comprising:
   a first electrode and a second electrode;
   a plurality of semiconductor nanowires in electrical communication with the first electrode and the second electrode;
   a J-aggregate electrostatically associated with at least a portion of the plurality of semiconductor nanowires.

2. The device of claim 1, wherein the plurality of semiconductor nanowires includes a Group II-VI compound, a Group II-V compound, a Group III-VI compound, a Group III-V compound, a Group IV-VI compound, a Group I-III-VI compound, a Group II-IV-VI compound, a Group IV compound, a Group II-IV-V compound, or a mixture thereof.

3. The device of claim 2, wherein the plurality of semiconductor nanowires includes ZnS, ZnSe, ZnTe, CdS, CdSe, CdTe, HgS, HgSe, HgTe, AN, AlP, AlAs, AlSb, GaN, GaP, GaAs, GaSb, GaSe, InN, InP, InAs, InSb, TIN, TIP, TlAs, TlSb, PbS, PbSe, PbTe, Si, Ge, or a mixture thereof.

4. The device of claim 3, the plurality of semiconductor nanowires includes a ligand bound to a surface of the semiconductor nanowire, wherein the ligand includes a first moiety having an affinity for a surface of the nanowire, and a second moiety bearing an electrostatic charge.

5. The device of claim 4, wherein the J-aggregate bears an electrostatic charge opposite to the electrostatic charge of the second moiety.

6. The device of claim 4, wherein the ligand is a polydentate ligand.

7. The device of claim 4, wherein the ligand includes more than one moiety bearing an electrostatic charge.

8. The device of claim 4, wherein the ligand is an oligomer or polymer.

9. A method of making a device, comprising:
   forming a plurality of semiconductor nanowires;
   contacting the plurality of semiconductor nanowires with a ligand, wherein the ligand includes a first moiety having an affinity for a surface of the nanowire, and a second moiety bearing an electrostatic charge;
   contacting the plurality of semiconductor nanowires with a J-aggregate; and
   arranging the plurality of semiconductor nanowires in electrical communication with a first electrode and a second electrode.

10. The method of claim 9, wherein the plurality of semiconductor nanowires includes a Group II-VI compound, a Group II-V compound, a Group III-VI compound, a Group III-V compound, a Group IV-VI compound, a Group I-III-VI compound, a Group II-IV-VI compound, a Group IV compound, a Group II-IV-V compound, or a mixture thereof.

11. The method of claim 10, wherein the plurality of semiconductor nanowires includes ZnS, ZnSe, ZnTe, CdS, CdSe, CdTe, HgS, HgSe, HgTe, AN, AlP, AlAs, AlSb, GaN, GaP, GaAs, GaSb, GaSe, InN, InP, InAs, InSb, TIN, TIP, TlAs, TlSb, PbS, PbSe, PbTe, Si, Ge, or a mixture thereof.

12. The method of claim 9, wherein forming the plurality of semiconductor nanowires includes:
   contacting a first electrode and a second electrode with a reactant solution; and
   applying an electric field across the first electrode and the second electrode, wherein at least one electrode includes a catalyst.

13. The method of claim 12, wherein the first electrode and the second electrode are supported on a substrate.

14. The method of claim 12, wherein the substrate includes glass, quartz, or silicon.

15. The method of claim 12, wherein the first electrode and the second electrode are facing electrodes separated by a gap.

16. The method of claim 15, wherein the gap is between 10 nm and 100 microns in width.

17. The method of claim 12, wherein at least one electrode includes platinum and titanium.

18. The method of claim 12, wherein the catalyst includes a seed particle.

19. The method of claim 12, wherein the catalyst includes bismuth.

20. The method of claim 12, further comprising heating the reactant solution to a growth temperature between 120° C. and 400° C.

21. The method of claim 12, wherein the reactant solution includes a metal source and a chalcogenide source.

22. The method of claim 21, wherein the metal source includes cadmium.

23. The method of claim 22, wherein the chalcogenide source includes selenium.

* * * * *